United States Patent
Toba et al.

(10) Patent No.: US 11,154,902 B2
(45) Date of Patent: Oct. 26, 2021

(54) TRANSPARENT CONDUCTIVE SUBSTRATE AND METHOD FOR PRODUCING SAME

(71) Applicant: SHOW A DENKO K.K., Tokyo (JP)

(72) Inventors: Masahiko Toba, Tokyo (JP); Eri Nakazawa, Tokyo (JP); Shigeru Yamaki, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/465,317

(22) PCT Filed: Nov. 29, 2017

(86) PCT No.: PCT/JP2017/042823
§ 371 (c)(1),
(2) Date: May 30, 2019

(87) PCT Pub. No.: WO2018/101334
PCT Pub. Date: Jun. 7, 2018

(65) Prior Publication Data
US 2019/0388933 A1 Dec. 26, 2019

(30) Foreign Application Priority Data

Dec. 1, 2016 (JP) .............................. JP2016-234242
Jul. 26, 2017 (JP) .............................. JP2017-144454

(51) Int. Cl.
*B32B 27/40* (2006.01)
*B05D 5/12* (2006.01)
(Continued)

(52) U.S. Cl.
CPC ................. *B05D 1/36* (2013.01); *B05D 5/12* (2013.01); *B05D 7/24* (2013.01); *B32B 7/02* (2013.01);
(Continued)

(58) Field of Classification Search
CPC .. B05D 5/12; B32B 7/02; B32B 27/18; B32B 27/325; B32B 27/38; B32B 27/40;
(Continued)

(56) References Cited

U.S. PATENT DOCUMENTS 9,236,162 B2 * 1/2016 Suganuma ........... H01B 13/003
2007/0074316 A1 3/2007 Alden et al.
(Continued)

FOREIGN PATENT DOCUMENTS

JP 2007297604 A * 11/2007 ............. C08G 59/42
JP 2009-505358 A 2/2009
(Continued)

OTHER PUBLICATIONS

JP-2007297604_Nov. 2007_English Translation.*
(Continued)

*Primary Examiner* — Michael L Leonard
(74) *Attorney, Agent, or Firm* — Sughrue Mion, PLLC

(57) ABSTRACT

To provide: a transparent conductive substrate containing silver nanowires and having excellent optical characteristics, electrical characteristics and light resistance; and a method for producing the same. A transparent conductive substrate characterized by comprising: a substrate; a transparent conductive film formed on at least one principal surface of the substrate, and containing a binder resin and conductive fibers; and a protective film formed on the transparent conductive film, wherein the thermal decomposition starting temperature of the binder resin is 210° C. or higher, and the protective film is a thermal-cured film obtained using a thermosetting resin.

13 Claims, 1 Drawing Sheet

(51) Int. Cl.
| | |
|---|---|
| *B05D 1/36* | (2006.01) |
| *B05D 7/24* | (2006.01) |
| *B32B 7/02* | (2019.01) |
| *B32B 27/18* | (2006.01) |
| *C08G 59/42* | (2006.01) |
| *C08K 3/08* | (2006.01) |
| *C08K 7/06* | (2006.01) |
| *C08L 39/02* | (2006.01) |
| *H01B 5/14* | (2006.01) |
| *H01B 13/22* | (2006.01) |
| *H05K 1/09* | (2006.01) |
| *B32B 27/38* | (2006.01) |
| *B32B 27/32* | (2006.01) |
| *B82Y 10/00* | (2011.01) |
| *B82Y 30/00* | (2011.01) |

(52) U.S. Cl.
CPC ............ *B32B 27/18* (2013.01); *B32B 27/325* (2013.01); *B32B 27/38* (2013.01); *B32B 27/40* (2013.01); *C08G 59/4246* (2013.01); *C08K 3/08* (2013.01); *C08K 7/06* (2013.01); *C08L 39/02* (2013.01); *H01B 5/14* (2013.01); *H01B 13/22* (2013.01); *H05K 1/09* (2013.01); *B82Y 10/00* (2013.01); *B82Y 30/00* (2013.01); *C08K 2003/0806* (2013.01); *C08K 2201/001* (2013.01); *C08K 2201/011* (2013.01); *H05K 2201/026* (2013.01)

(58) Field of Classification Search
CPC .. C08G 59/4246; C08G 18/0823; C08K 3/08; C08K 7/06
See application file for complete search history.

(56) References Cited

U.S. PATENT DOCUMENTS

| | | |
|---|---|---|
| 2008/0143906 A1 | 6/2008 | Allemand et al. |
| 2010/0307792 A1 | 12/2010 | Allemand et al. |
| 2013/0126799 A1 | 5/2013 | Naoi |
| 2013/0216826 A1 | 8/2013 | Nakamoto et al. |
| 2014/0034360 A1 | 2/2014 | Tanaka et al. |
| 2016/0205775 A1 | 7/2016 | Uchida et al. |
| 2016/0216790 A1 | 7/2016 | Ebihara et al. |

FOREIGN PATENT DOCUMENTS

| | | |
|---|---|---|
| JP | 2016-222847 A | 2/2009 |
| JP | 2010-507199 A | 3/2010 |
| JP | 2011-204649 A | 10/2011 |
| JP | 2012-230881 A | 11/2012 |
| JP | 2013-170210 A | 9/2013 |
| JP | 2015-18824 A | 1/2015 |
| JP | 2015-189164 A | 11/2015 |
| WO | 2009/035059 A1 | 3/2009 |
| WO | 2012/141058 A1 | 10/2012 |
| WO | 2015/025792 A1 | 2/2015 |
| WO | 2015/056445 A1 | 4/2015 |
| WO | 20174/155024 A1 | 9/2017 |

OTHER PUBLICATIONS

WO-200923971 _Cited on ISR_Mar. 2009_English Translation.*
International Search Report for PCT/JP2017/042823 dated Jan. 30, 2018 (PCT/ISA/210).

* cited by examiner

[FIG. 1]
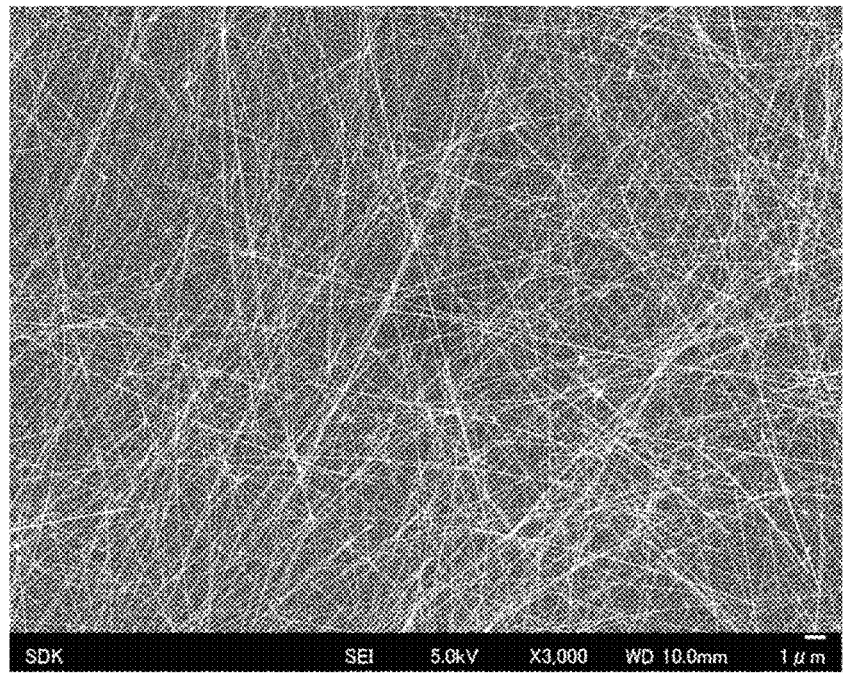
[FIG. 2]
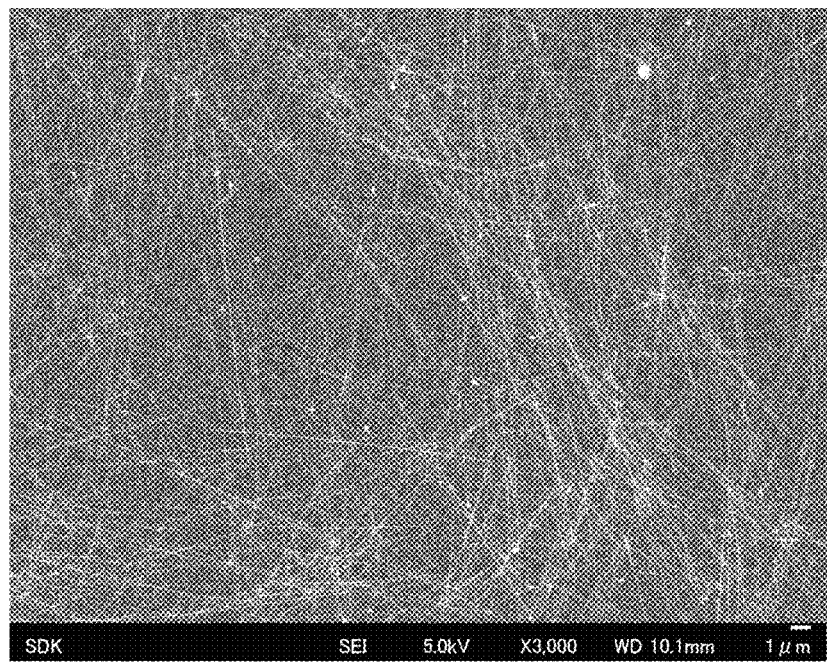

TRANSPARENT CONDUCTIVE SUBSTRATE AND METHOD FOR PRODUCING SAME

CROSS REFERENCE TO RELATED APPLICATIONS

This application is a National Stage of International Application No. PCT/JP2017/042823 filed Nov. 29, 2017, claiming priority based on Japanese Patent Application No. 2016-234242, filed Dec. 1, 2016 and Japanese Patent Application No. 2017-144454 filed Jul. 26, 2017.

TECHNICAL FIELD

The present disclosure relates to a transparent conductive substrate and a method for producing the same.

BACKGROUND ART

A transparent conductive film is used in various fields such as a transparent electrode for a liquid crystal display (LCD), a plasma display panel (PDP), an organic electroluminescence type display, photovoltaics (PV), and a touch panel (TP), an electro-static discharge (ESD) film, and an electromagnetic interference (EMI) film, etc. For these transparent conductive films, conventionally, a film using ITO (Indium Tin Oxide) has been used. However, there are drawbacks that the supply stability of indium is low, the production cost is high, the flexibility is inferior, and a high temperature is required when the film is formed. Therefore, transparent conductive films which can replace the ITO film has been actively searched. Among such films, a transparent conductive film containing metal nanowires is preferable as a transparent conductive film substituting the ITO film, in view of its superior conductivity, optical property, and flexibility, and its advantages that a film can be formed by a wet process, a production cost is low, and a high temperature is not required at the time of forming a film, and the like. For example, a transparent conductive film containing silver nanowires, and having a superior conductivity, optical property, and flexibility is known (refer to Patent Document 1).

Recently, touch panels are applied in smartphones, car navigation systems, vending machines, and the like, and the touch panels have become widely used in outdoors. Different from the indoor use, the touch panel is exposed to sunlight during the outdoor use, and thus, durability to light, in addition to the durability against temperature and humidity, is required.

For example, Patent Document 2 discloses the improvement of light resistance by providing a resin layer containing a metal additive, on metal fibers. If a metal particle is used for the metal additive, the particle scatters light, and thus, there is a concern that the visibility may be decreased. Patent Document 2 describes the change in resistance before and after the light resistance test, but has no description regarding the optical property after the light resistance test.

Further, Patent Document 3 discloses the improvement of the light resistance and the migration resistance by controlling the halogen content to low, in the conductive film containing metal nanowires as conductive fibers. According to the studies by the inventors of the present disclosure, in some results, the light resistance becomes worse even if the halogen content is within the range described in Patent Document 3. Further, Patent Document 3 only describes the measurement of the surface resistance of a non-conductive portion in a patterned portion, but failed to describe the results of migration evaluation.

There are drawbacks that the transparent conductive film containing silver nanowires has a large surface area per mass of silver, and thus, can easily react with various compounds, leading to low environmental tolerance. Due to influences from various medical agents or cleaning solutions used in the processes, or influences from oxygen or moisture in the air to which the film is exposed during the long-term storage, the nano structure is corroded, resulting in the decrease in conductivity. Further, in particular, when the film is used for electronic materials, in order to prevent adhesion or mixture of fine particle-like impurities, dust and dirt, etc., onto a substrate surface, a physical cleaning process using a brush, etc., is often performed. However, the damage on to the surface due to this physical cleaning may also be a problem.

In order to solve the drawbacks, there have been may attempts of providing a protective film on the surface of the transparent conductive film having silver nanowires to apply hardness and environmental tolerance to the transparent conductive film. Also, because electrical connection between the wirings of an electronic circuit and the transparent conductive film is required, there is a desire for a protective film capable of maintaining electrical contact from the protective film surface to the transparent conductive film.

In order to solve these drawbacks, various considerations have been made for the protective layer of the transparent conductive film. For example, Patent Document 4 proposes a method for protecting a transparent conductive film using a specific thermosetting composition, wherein a thin protective layer is provided to maintain the electrical contact. In addition, as an example of a method for forming a protective film, a spin coating method is described, and a thin film of approximately 100 nm thick is formed. However, Patent Document 4 only focuses on the performance of the protective layer, and fails to focus on the reliability obtained by the combination of the conductive layer and the protective layer.

Further, Patent Document 5 discloses the film forming using a protective film composition containing a corrosion inhibitor, at a high temperature of 150° C., to thereby increase the environmental tolerance. During the film forming, the protective film is exposed to the high temperature of 150° C., thus, there is a concern that several problems such as generation of distortion, decrease of optical properties, etc., may occur, depending on the material used.

PRIOR ARTS

Patent Document 1: Japanese Unexamined Patent Publication (Kohyo) No. 2010-507199
Patent Document 2: WO 2015/056445 pamphlet
Patent Document 3: Japanese Unexamined Patent Publication (Kokai) No. 2012-230881
Patent Document 4: Japanese Unexamined Patent Publication (Kokai) No. 2013-170210
Patent Document 5: Japanese Unexamined Patent Publication (Kokai) No. 2015-18824

SUMMARY

One of the objectives of the present disclosure is to provide a transparent conductive substrate containing conductive fibers and having a superior optical property and a superior electrical property, as well as a superior light resistance, and a method for producing the same. Further, one of the objectives of the present disclosure is to provide a transparent conductive substrate provided with a protective film capable of maintaining an electrical contact property to a transparent conductive film containing conductive fibers, and capable of applying a high environmental resistance to the transparent conductive film, and a method for producing the same.

In order to attain the above objective, the present disclosure has the following aspects.

[1] A transparent conductive substrate comprising, a substrate, a transparent conductive film formed on at least one main face of the substrate and containing a binder resin and conductive fibers, and a protective film formed on the transparent conductive film, wherein the binder resin has a thermal decomposition starting temperature of 210° C. or higher, and the protective film is a thermal-cured film made of a thermosetting resin.

[2] A transparent conductive substrate according to [1], wherein the binder resin contains a polymer having 70 mol % or more of N-vinylacetamide as a monomer unit.

[3] A transparent conductive substrate according to [2], wherein the polymer is a homopolymer of N-vinylacetamide (NVA).

[4] A transparent conductive substrate according to any one of [1] to [3], wherein the conductive fiber is a metal nanowire.

[5] A transparent conductive substrate according to [4], wherein the metal nanowire is a silver nanowire.

[6] A transparent conductive substrate according to any one of [1] to [5], wherein the protective film is a thermal-cured film containing (A) a polyurethane containing a carboxyl group, (B) an epoxy compound, and (C) a curing accelerator.

[7] A transparent conductive substrate according to any one of [4] to [6], wherein the mass ratio between the binder resin and the metal nanowire (binder resin/metal nanowire) is 0.8 or more and 20 or less.

[8] A transparent conductive substrate according to any one of [1] to [7], wherein both of the protective film and the binder resin have no aromatic ring in a molecule.

[9] A transparent conductive substrate according to any one of [1] to [4], wherein the substrate is a resin film.

[10] A method for producing a transparent conductive substrate comprising: a step of forming a transparent conductive film by a conductive ink which contains a binder resin having a thermal decomposition starting temperature of 210° C. or higher and conductive fibers, on at least one main face of a substrate, a step of forming a protective film, by a thermosetting protective film ink, on the transparent conductive film, and a step of heating and curing the protective film.

[11] A method for producing a transparent conductive substrate according to [10], wherein the binder resin contains a polymer having 70 mol % or more of N-vinylacetamide (NVA) as a monomer unit.

[12] A method for producing a transparent conductive substrate according to [11], wherein the polymer is a homopolymer of N-vinylacetamide (NVA).

[13] A method for producing a transparent conductive substrate according to any one of [10] to [12], wherein the conductive fiber is a metal nanowire.

[14] A method for producing a transparent conductive substrate according to [13], wherein the metal nanowire is a silver nanowire.

[15] A method for producing a transparent conductive substrate according to any one of [10] to [14], wherein the thermosetting protective film ink contains (A) a polyurethane containing a carboxyl group, (B) an epoxy compound, (C) a curing accelerator, and (D) a solvent, and the content of (D) solvent is 95.0% by mass or more and 99.9% by mass or less.

[16] A method for producing a transparent conductive substrate according to [13] or [15], wherein the mass ratio between the binder resin and the metal nanowire (binder resin/metal nanowire) is 0.8 or more and 20 or less.

According to the present disclosure, a transparent conductive substrate containing conductive fibers and having a superior optical property and a superior electrical property, as well as a superior light resistance, and a method for producing the same, can be provided. Further, a transparent conductive substrate provided with a protective film capable of maintaining an electrical contact property to a transparent conductive film containing conductive fibers, and capable of applying a high environmental resistance to the transparent conductive film, and a method for producing the same, can be provided.

BRIEF DESCRIPTION OF DRAWINGS

FIG. 1 is a SEM photograph of a conductive substrate according to Example 1 after the light resistance test.

FIG. 2 a SEM photograph of a conductive substrate according to Comparative Example 1 after the light resistance test.

ASPECT OF DISCLOSURE

Hereinbelow, aspects of the present disclosure (hereinbelow, referred to as aspects) will be explained.

The transparent conductive substrate according to the present aspect comprises a substrate, a transparent conductive film formed on at least one main face of the substrate and containing a binder resin and conductive fibers, and a protective film formed on the transparent conductive film, wherein the binder resin has a thermal decomposition starting temperature of 210° C. or higher, and the protective film is a thermal-cured film made of a thermosetting resin.

[Substrate]

The substrate may be colored, but preferably has a high total light transmittance (transparency to visible light), the total light transmittance being preferably 80% or higher. For example, glass, or a resin film such as polyester (polyethylene terephthalate [PET], polyethylene naphthalate [PEN], etc.), polycarbonate, acrylic resin (polymethyl methacrylate [PMMA], etc.), cycloolefin polymer, and the like, may be preferably used. Among these resin films, in view of the superior light transmittance (transparency), flexibility, mechanical property, etc., using polyethylene terephthalate, cycloolefin polymer is preferable. Examples of the cycloolefin polymer include: hydrogenated ring-opening metathesis polymerization type cycloolefin polymer of norbornene (ZEONOR (registered trademark, manufactured by Zeon Corporation), ZEONEX (registered trademark, manufactured by Zeon Corporation), ARTON (registered trademark, manufactured by JSR Corporation), etc.), norbornene/ethylene addition copolymer type cycloolefin polymer (APEL (registered trademark, manufactured by Mitsui Chemicals Inc.), TOPAS (registered trademark, manufactured by Polyplastics Co., Ltd.)).

[Transparent Conductive Film]

The conductive fiber structuring the transparent conductive film may be metal nanowire, carbon fiber, etc., and using the metal nanowire is preferable. The metal nanowire is a conductive material made of metal and having a wire shape with a diameter in the order of nanometer. In the present aspect, in addition to (by mixing with) or instead of the metal nanowire, metal nanotube which is a conductive material having a porous or nonporous tubular shape, may be used. In the present specification, both the "wire shape" and the "tubular shape" refer to a linear shape, but the former refers to a solid body, while the latter refers to a hollow body. Both may be soft or rigid. The former is referred to as "metal nanowire in a narrow sense", and the latter is referred to a "metal nanotube in a narrow sense". Hereinbelow, in the present specification, the term "metal nanowire" is used to include both the metal nanowire in a narrow sense and the metal nanotube in a narrow sense. Only the metal nanowire in a narrow sense, or only the metal nanotube in a narrow sense may be used, or they may be mixed for use.

As a method for producing the metal nanowire or the metal nanotube, a know method may be applied. For example, silver nanowires may be synthesized by reducing the silver nitrate under the presence of polyvinylpyrrolidone, using a polyol method (refer to Chem. Mater., 2002, 14, 4736). Similarly, gold nanowires may be synthesized by reducing the gold chloride acid hydrate under the presence of polyvinylpyrrolidone (refer to J. Am. Chem. Soc., 2007, 129, 1733). WO 2008/073143 pamphlet and WO 2008/046058 pamphlet have detailed description regarding the technology of large scale synthesis and purification of silver nanowires and gold nanowires. Gold nanotubes having a porous structure may be synthesized by using silver nanowires as templates, and reducing a gold chloride acid solution. The silver nanowires used as templates are dissolved in the solution by oxidation-reduction reaction with the gold chloride acid, and as a result, gold nanotubes having a porous structure can be produced (refer to J. Am. Chem. Soc., 2004, 126, 3892-3901).

Specifically, the metal nanowires and the metal nanotubes have an average diameter size of preferably 1 to 500 nm, more preferably 5 to 200 nm, still more preferably 5 to 100 nm, and particularly preferably 10 to 100 nm. The metal nanowires and the metal nanotubes have an average major axis length of preferably 1 to 100 μm, more preferably 1 to 80 μm, still more preferably 2 to μm, and particularly preferably 5 to 50 μm. While satisfying the above average diameter size and the average major axis length, the metal nanowires and the metal nanotube have an average aspect ratio of preferably more than 5, more preferably 10 or more, still more preferably 100 or more, and particularly preferably 200 or more. Here, the aspect ratio refers to a value obtained by a/b, wherein "b" represents an average diameter size of the metal nanowire and the metal nanotube and "a" represents an average major axis length thereof. The values "a" and "b" may be measured by a scanning electron microscope (SEM) and an optical microscope. Specifically, diameters of ten or more metal nanowires are respectively measured by the SEM (FE-SEM SU8020, manufactured by Hitachi High-Technologies Corporation), and lengths of 100 or more metal nanowire are respectively measured by the optical microscope (VHX-600, manufactured by Keyence Corporation), and the arithmetic average values were obtained for the average diameter and the average length.

The kind of the metal as a material for the metal nanowires may be one selected from the group consisting of gold, silver, platinum, copper, nickel, iron, cobalt, zinc, ruthenium, rhodium, palladium, cadmium, osmium, and iridium, or may be an alloy etc., formed by combining some of these. In order to obtain a coating film having a low surface resistance and a high total light transmittance, containing at least one of gold, silver, and copper is preferable. These metals have a high conductivity, and thus, when a certain surface resistance should be obtained, the density of the metal within the surface may be reduced, and high total light transmittance can be achieved.

Among these metals, containing at least gold or silver is preferable. The most appropriate example may be the silver nanowire.

As for the binder resin structuring the transparent conductive film, a binder having a thermal decomposition starting temperature of 210° C. or higher may be used. Specifically, the binder may be poly-N-vinylacetamide (PNVA). Poly-N-vinylacetamide is a homopolymer of N-vinylacetamide (NVA), but a copolymer having 70 mol % of N-vinylacetamide (NVA) may also be used. Examples of a monomer which can be copolymerized with NVA include: N-vinylformamide, N-vinylpyrrolidone, acrylic acid, methacrylic acid, sodium acrylate, sodium methacrylate, acrylamide, acrylonitrile, and the like. The more the content of the copolymerized component, the higher the sheet resistance of the transparent conductive pattern to be obtained, the lower the adhesion between the silver nanowires and the substrate, and the lower the heat resistance (thermal decomposition starting temperature). Therefore, the polymer contains the monomer unit derived from N-vinylacetamide preferably 70 mol % or more, more preferably 80 mol % or more, and still more preferably 90 mol % or more. Such a polymer has a weight average molecular weight in terms of pullulan of preferably 30,000 to 4,000,000, more preferably 100,000 to 3,000,000, and still more preferably 300,000 to 1,500,000.

The thermal decomposition starting temperature of the binder resin is preferably 230° C. or higher, and more preferably 250° C. However, this does not prevent the use of a binder resin having a thermal decomposition starting temperature of less than 210° C. In this case, the ratio of NVA in the copolymer is preferably 50 mol % or more.

The transparent conductive film is formed by printing a conductive ink which contains the binder resin, conductive fibers, and a solvent, on at least one main face of a substrate to form a conductive pattern (conductive ink coated film), and by making the conductive pattern to be conductive. The solvent is not particularly limited as far as the conductive fibers can be dispersed well in the solvent, and the binder resin can dissolve in the solvent. When the binder resin is water-insoluble, γ-butyrolactone may be an example. When the binder resin is water-soluble, a mixture solvent of alcohol and water is preferable because the drying rate can be easily controlled. For the alcohol, at least one type of saturated monohydric alcohol having 1 to 3 carbon atoms (methanol, ethanol, normal-propanol, and isopropanol), represented by $C_nH_{2n+1}OH$ (n represents an integer of 1 to 3) [hereinbelow, simply described as "saturated monohydric alcohol having 1 to 3 carbon atoms"] is contained. Preferably, the content of the saturated monohydric alcohol having 1 to 3 carbon atoms is 40% by mass or more of the alcohol in total. Using the saturated monohydric alcohol having 3 or less carbon atoms is advantageous in the process because it becomes easy to dry. As alcohol, an alcohol other than the saturated monohydric alcohol having 1 to 3 carbon atoms can be used together. The other than the saturated monohydric alcohol having 1 to 3 carbon atoms, which can be used, may be ethylene glycol, propylene glycol, ethylene glycol monomethyl ether, ethylene glycol monoethyl ether, propylene glycol monomethyl ether, propylene glycol monoethyl ether, and the like. If any of these alcohols is used together with the saturated monohydric alcohol having 1 to 3 carbon atoms, the drying rate may be adjusted. Further, the content of alcohol in the mixture solvent is preferably 5 to 90% by mass in alcohol in total. If the alcohol content in the mixture solvent is less than 5% by mass or exceeding 90% by mass, there are drawbacks such that a strip pattern (uneven coating) is generated at the time of coating.

The conductive ink can be produced by stirring and mixing the binder resin, the conductive fibers, and the solvent, using a planetary centrifugal stirrer. The content of the binder resin in the conductive ink is preferably in the range of 0.01 to 1.0% by mass. The content of the conductive fiber contained in the conductive ink is preferably in the range of 0.01 to 1.0% by mass. The content of the solvent in the conductive ink is preferably in the range of 98.0 to 99.98% by mass.

The conductive ink may be printed by a bar-coating method, spin-coating method, spray coating method, gravure printing, slit coating, and the like. The shape of the transparent conductive film formed thereby, or a transparent conductive pattern is not particularly limited, but may be a shape of wiring or electrode pattern formed on the substrate, a shape of a film covering the entirety or a part of the substrate (solid paint pattern), or the like. The formed conductive pattern can be made conductive by heating and drying the solvent. Further, in accordance with needs, appropriate photo irradiation may be applied to the conductive pattern.

[Protective Film]

For the protective film which protects the transparent conductive film, a thermosetting resin is used. Using a photocurable resin is not preferable, because curing occurs by absorbing light, and thus, a component which absorbs light remains in a cured film. Among the thermosetting resins, preferably, a protective film ink comprising (A) a polyurethane containing a carboxyl group, (B) an epoxy compound, (C) a curing accelerator, and (D) a solvent is printed, coated, etc., on the transparent conductive film, and cured to form a protective film. Curing of the protective film ink can be performed by heating and drying the protective film ink.

The (A) polyurethane having a carboxyl group has a number average molecular weight of preferably 1,000 to 100,000, more preferably 2,000 to 70,000, and still more preferably 3,000 to 50,000. Here, the molecular weight is a polystyrene equivalent value measured by gel permeation chromatography (hereinbelow, referred to as GPC). If the molecular weight is less than 1,000, the elongation property, the flexibility, and the strength of the printed film may be decreased. Whereas, if the molecular weight exceeds 100,000, the solubility of polyurethane to the solvent is decreased, and even when polyurethane can dissolve in the solvent, the viscosity becomes too high, which may cause great limitations in use.

In the present specification, the measurement conditions of GPC are as follows, unless specifically described:

Device Name: HPLC unit HSS-2000, manufactured by JASCO Corporation

Column: Shodex Column LF-804

Mobile Phase: tetrahydrofuran

Flow Rate: 1.0 mL/min

Detector: RI-2031 Plus manufactured by JASCO Corporation

Temperature: 40.0° C.

Sample Volume: sample loop 100 μL

Sample Concentration: Prepared to approximately 0.1% by mass

The (A) polyurethane containing a carboxyl group has an acid value of preferably 10 to 140 mg-KOH/g, and more preferably 15 to 130 mg-KOH/g. If the acid value is less than 10 mg-KOH/g, the curing property is decreased, and the solvent resistance becomes worse. Whereas, if the acid value exceeds 140 mg-KOH/g, the solubility to the solvent as a urethane resin decreases, and even when the urethane resin can dissolve in the solvent, the viscosity becomes too high, which makes the handling difficult. In addition, the cured product becomes too hard, which may cause problems such as warpage, etc., depending on the base film.

Further, in the present specification, the acid value of a resin is a value measured by the following method.

Approximately 0.2 g of sample is precisely weighed by a precision balance into a 100 ml Erlenmeyer flask, and 10 ml of a mixture solvent of ethanol/toluene=1/2 (mass ratio) is provided thereto to dissolve the sample. Further, 1 to 3 drops of a phenolphthalein ethanol solution is added to the container as an indicator, which is sufficiently stirred until the sample becomes uniform. The resultant is subjected to titration with a 0.1 N potassium hydroxide ethanol solution. When the indicator continues to be in light red for 30 seconds, it is determined that the neutralization ends. The value obtained from the result using the following calculation formula is treated as an acid value of the resin.

Acid Value (mg-KOH/g)=$[B \times f \times 5.611]/S$

B: Use amount (ml) of 0.1 N potassium hydroxide ethanol solution f: Factor of 0.1 N potassium hydroxide ethanol solution S: Collection quantity (g) of sample More specifically, the polyurethane (A) containing a carboxyl group is polyurethane synthesized by using (a1) a polyisocyanate compound, (a2) a polyol compound, and (a3) a dihydroxy compound containing a carboxyl group, as monomers. From the viewpoint of light resistance, preferably, each of (a1), (a2), and (a3) does not contain a functional group with conjugate properties such as an aromatic compound.

Hereinbelow, each monomer will be explained in more detail.

(a1) Polyisocyanate Compound

For (a1) polyisocyanate compound, usually, diisocyanate which has two isocyanato groups per molecule is used. Examples of the polyisocyanate compound include: aliphatic polyisocyanate, alicyclic polyisocyanate, and the like. One of them may be used by itself, or two or more of them may be used in combination. As far as (A) polyurethane containing a carboxyl group is not turned into a gel, a small amount of polyisocyanate having three or more isocyanato groups may also be used.

Examples of the aliphatic polyisocyanate include: 1,3-trimethylene diisocyanate, 1,4-tetramethylene diisocyanate, 1,6-hexamethylene diisocyanate, 1,9-nonamethylene diisocyanate, 1,10-decamethylene diisocyanate, 2,2,4-trimethylhexamethylene diisocyanate, 2,4,4-trimethylhexamethylene diisocyanate, lysine diisocyanate, 2,2'-diethyl ether diisocyanate, dimer acid diisocyanate, and the like.

Examples of the alicyclic polyisocyanate include: 1,4-cyclohexane diisocyanate, 1,3-bis(isocyanatomethyl)cyclohexane, 1,4-bis(isocyanatomethyl)cyclohexane, 3-isocyanatomethyl-3,3,5-trimethylcyclohexane (IPDI, isophorone diisocyanate), bis(4-isocyanato cyclohexyl)methane (Hydrogenated MDI), hydrogenated (1,3- or 1,4-)xylylene diisocyanate, norbornane diisocyanate, and the like.

Here, if an alicyclic compound having 6 to 30 carbon atoms other than the carbon atoms in the isocyanato group (—NCO group) is used as (a1) polyisocyanate compound, a protective film formed by the polyurethane resin according to the present aspect has high reliability particularly under high temperature and high humidity, and is suitable as a member for an electronic device component.

From the viewpoints of weather resistance and light resistance, as for (a1) polyisocyanate compound, using a compound which does not have an aromatic ring is preferable. The content of the aromatic polyisocyanate and the aromatic-aliphatic polyisocyanate is preferably 50 mol % or less, more preferably 30 mol % or less, and still more preferably 10 mol % or less, relative to the total amount (100 mol %) of (a1) polyisocyanate compound.

The alicyclic compound may be 1,4-cyclohexane diisocyanate, isophorone diisocyanate, bis(4-isocyanato cyclohexyl) methane, 1,3-bis(isocyanatomethyl) cyclohexane, 1,4-bis(isocyanatomethyl) cyclohexane, and the like.

(a2) Polyol Compound

The number average molecular weight of (a2) polyol compound (with the proviso that (a2) polyol compound does not include (a3) dihydroxy compound having a carboxyl group) is usually 250 to 50,000, preferably 400 to 10,000, and more preferably 500 to 5,000. The molecular weight is a polystyrene equivalent value measured by the GPC under the above mentioned conditions.

Examples of (a2) polyol compound include: polycarbonate polyol, polyether polyol, polyester polyol, polylactone polyol, polysilicone having hydroxyl groups at both ends, and a polyol compound having 18 to 72 carbon atoms obtained by adding hydrogen to a polycarboxylic acid derived from a C18 (carbon atom number 18) unsaturated fatty acid made from vegetable oil and a polymer thereof, and converting the carboxylic acid into hydroxyl groups. Among them, in view of the balance of the water resistance, the insulation reliability, and the adhesion to a base material, polycarbonate polyol is preferable.

The polycarbonate polyol can be obtained from diol having 3 to 18 carbon atoms as a raw material, through reaction with carbonate ester or phosgene, and can be represented by, for example, the following structural formula (1):

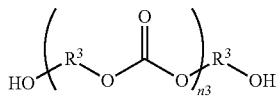

(1)

In Formula (1), $R^3$ represents a residue after removing a hydroxyl group from a corresponding diol (HO—$R^3$—OH), $n_3$ represents a positive integer, which is preferably 2 to 50.

Specific examples of the raw material used for producing the polycarbonate polyol represented by Formula (1) include: 1,3-propanediol, 1,4-butanediol, 1,5-pentanediol, 1,6-hexanediol, 3 methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethylene glycol, and 1,2-tetradecanediol, etc.

The polycarbonate polyol may be a polycarbonate polyol (copolymerized polycarbonate polyol) having a plurality of types of alkylene groups in its skeleton. Using a copolymerized polycarbonate polyol is advantageous in many cases from the viewpoint of preventing crystallization of (A) polyurethane containing a carboxyl group. Further, taking the solubility to the solvent into account, using, in combination, a polycarbonate polyol having a branched skeleton and having hydroxyl groups at the ends of the branched chains, is preferable.

The polyether polyol is obtained by the dehydration condensation of a diol having 2 to 12 carbon atoms, or the ring-opening polymerization of an oxirane compound, oxetane compound, or tetrahydrofuran compound having 2 to 12 carbon atoms, and may be represented by, for example, the following structural formula (2):

(2)

In Formula (2), $R^4$ represents a residue obtained by removing a hydroxyl group from a corresponding diol (HO—$R^4$—OH), $n_4$ represents a positive integer, which is preferably 4 to 50. One type of the diol having 2 to 12 carbon atoms may be used by itself to form a homopolymer, or two or more types may be used in combination to form a copolymer.

Specific examples of the polyether polyol represented by the above Formula (2) include: polyalkylene glycols such as polyethylene glycol, polypropylene glycol, poly-1,2-butylene glycol, polytetramethylene glycol (poly 1,4-butanediol), poly-3-methyltetramethylene glycol, polyneopentyl glycol, and the like. Further, in order to increase the hydrophobic property of the polyether polyol, a copolymer of these, for example, a copolymer of 1,4-butanediol and neopentyl glycol, etc., may be used.

The polyester polyol may be obtained by a transesterification of diol with a dehydration condensation product of a dicarboxylic acid and a diol, or a transesterification of diol with an ester of a dicarboxylic acid and a lower alcohol, and may be represented by, for example, the following structural formula (3):

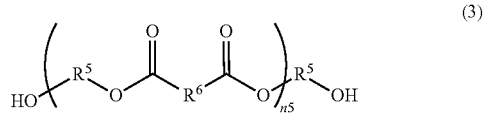

(3)

In Formula (3), $R^5$ represents a residue obtained by removing a hydroxyl group from the corresponding diol (HO—$R^5$—OH), $R^6$ represents a residue obtained by removing two carboxyl groups from the corresponding dicarboxylic acid (HOCO—$R^6$—COOH), $n_5$ represents a positive integer, which is preferably 2 to 50.

Specific examples of the diol (HO—$R^5$—OH) include: ethylene glycol, 1,2-propanediol, 1,3-propanediol, 1,2-butanediol, 1,3-butanediol, 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethylene glycol, or 1,2-tetradecanediol, 2,4-diethyl-1,5-pentanediol, butyl ethyl propanediol, 1,3-cyclohexanedimethanol, diethylene glycol, triethylene glycol, dipropylene glycol, and the like.

Specific examples of the dicarboxylic acid (HOCO—$R^6$—COOH) include: succinic acid, glutaric acid, adipic acid, azelaic acid, sebacic acid, decane dicarboxylic acid, brasylic acid, 1,4-cyclohexane dicarboxylic acid, hexahydrophthalic acid, methyl tetrahydrophthalic acid, endomethylene tetrahydrophthalic acid, methyl endomethylene tetrahydrophthalic acid, chlorendic acid, fumaric acid, maleic acid, itaconic acid, citraconic acid.

The polylactone polyol may be obtained by the condensation reaction of a ring-opening polymerized lactone and a diol, or the condensation reaction of a diol and a hydroxy alkanoic acid, and may be represented by, for example, the following structural formula (4):

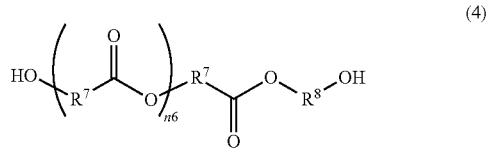

(4)

In Formula (4), $R^7$ represents a residue obtained by removing a hydroxyl group and a carboxyl group from a corresponding hydroxy alkanoic acid (HO—$R^7$—COOH), $R^8$ represents a residue obtained by removing a hydroxyl group from a corresponding diol (HO—$R^8$—OH), $n_6$ is a positive integer, which is preferably 2 to 50.

Specific examples of the hydroxy alkanoic acid (HO—$R^7$—COOH) include: 3-hydroxybutanoic acid, 4-hydroxypentanoic acid, 5-hydroxyhexanoic acid, and the like. Examples of lactone include ε-caprolactone.

The polysilicone having hydroxyl terminal groups at both ends may be represented by, for example, the following structural formula (5):

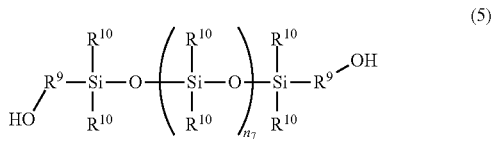

(5)

In Formula (5), $R^9$ independently represents a divalent aliphatic hydrocarbon residue having 2 to carbon atoms, $n_7$ is a positive integer, which is preferably 2 to 50. $R^9$ may include an ether group. Each of a plurality of $R^{10}$ independently represents an aliphatic hydrocarbon group having 1 to 12 carbon atoms.

Market products of the polysilicone having hydroxyl groups at both ends include, for example, "X-22-160AS, KF6001, KF6002, KF-6003" manufactured by Shin-Etsu Chemical Co., Ltd., and the like.

Specific examples of the "polyol compound having 18 to 72 carbon atoms obtained by adding hydrogen to a polycarboxilic acid derived from a C18 unsaturated fatty acid made from vegetable oil and a polymer thereof, and converting the carboxylic acid into hydroxyl groups" include a diol compound having a skeleton of a hydrogenated dimer acid, and a marketed product thereof is, for example, "Sovermol (registered trademark) 908" manufactured by Cognis.

As far as the effect of the present disclosure is not ruined, a diol having a molecular weight of 300 or less, which is usually used as a diol component for synthesizing polyester or polycarbonate may be used as (a2) polyol compound. Specific examples of such a low molecular weight diol include: ethylene glycol, 1,2-propanediol, 1,3-propanediol, 1,2-butanediol, 1,3-butanediol, 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethylene glycol, 1,2-tetradecanediol, 2,4-diethyl-1,5-pentanediol, butyl ethyl propanediol, 1,3-cyclohexanedimethanol, diethylene glycol, triethylene glycol, and dipropylene glycol, and the like.

(a3) Dihydroxy Compound Containing Carboxyl Group

Preferably, (a3) a dihydroxy compound containing a carboxyl group is a carboxylic acid or an amino carboxylic acid having a molecular weight of 200 or less, having two groups selected from a hydroxy group, a hydroxyalkyl group with one carbon, and a hydroxyalkyl group with 2 carbons, because a cross linking point is controllable. Specific examples include: 2,2-dimethylolpropionic acid, 2,2-dimethylolbutanoic acid, N,N-bis hydroxyethyl glycine, N,N-bis hydroxyethyl alanine, and the like. Among them, in view of the solubility to the solvent, 2,2-dimethylolpropionic acid, 2,2-dimethylolbutanoic acid are particularly preferable. One type of the compounds of (a3) dihydroxy compound containing a carboxyl group can be used by itself, or two or more types may be used in combination.

The above-mentioned (A) a polyurethane containing a carboxyl group can be synthesized from the above three components ((a1), (a2), and (a3)) only. However, (a4) a monohydroxy compound and/or (a5) a monoisocyanate compound may be further reacted for synthesis. In view of the light resistance, using a compound which does not have an aromatic ring and a carbon-carbon double bond in a molecule is preferable.

(a4) Monohydroxy Compound

An example of (a4) monohydroxy compound is a compound having a carboxyl group such as a glycolic acid, a hydroxypivalic acid, etc.

One type of (a4) monohydroxy compound can be used by itself, or two or more types of (a4) can be used in combination.

Other examples of (a4) monohydroxy compound include: methanol, ethanol, n-propanol, isopropanol, n-butanol, isobutanol, sec-butanol, t-butanol, amyl alcohol, hexyl alcohol, octyl alcohol, and the like.

(a5) Monoisocyanate Compound

Examples of (a5) monoisocyanate compound include: hexyl isocyanate, dodecyl isocyanate, and the like.

The above-mentioned (A) polyurethane containing a carboxyl group can be synthesized by reacting the above-mentioned (a1) polyisocyanate compound, (a2) polyol compound, and (a3) dihydroxy compound containing a carboxyl group, under the presence or absence of a known urethanization catalyst such as dibutyltin dilaurate, using an appropriate organic solvent. However, performing reaction without a catalyst is preferable because there would be no need to concern about the mixing of tin, etc., in the final product.

The organic solvent is not particularly limited as far as the reactivity with the isocyanate compound is low, but a preferable solvent is a solvent free from a basic functional group such as amine, etc., and having a boiling point of 50° C. or higher, preferably 80° C. or higher, and more preferably 100° C. or higher. Examples of such a solvent include: toluene, xylylene, ethylbenzene, nitrobenzene, cyclohexane, isophorone, diethylene glycol dimethyl ether, ethylene glycol diethyl ether, ethylene glycol monomethyl ether acetate, propylene glycol monomethyl ether acetate, propylene glycol monoethyl ether acetate, dipropylene glycol monomethyl ether acetate, diethylene glycol monoethyl ether acetate, methoxypropionic acid methyl, methoxypropionic acid ethyl, ethoxypropionic acid methyl, ethoxypropionic acid ethyl, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethyl sulfoxide, and the like.

Taking into account that it is not preferable to use an organic solvent in which the polyurethane to be generated does not dissolve well, and that the polyurethane is used as a raw material for the protective film ink used for an electronic material, propylene glycol monomethyl ether acetate, propylene glycol monoethyl ether acetate, dipropylene glycol monomethyl ether acetate, diethylene glycol monoethyl ether acetate, γ-butyrolactone, etc., are particularly preferable among the above.

The addition sequence of the raw materials is not limited, but usually, first, (a2) polyol compound and (a3) dihydroxy compound having a carboxyl group are provided, and dissolved or dispersed in the solvent, and thereafter, (a1) polyisocyanate compound is added by dropping at 20 to 150° C., and more preferably at 60 to 120° C., which is then reacted at 30 to 160° C., and preferably at 50 to 130° C.

The molar ratio of the added raw materials is adjusted in accordance with the molecular weight and the acid value of the objected polyurethane. In case that (a4) monohydroxy compound is introduced to polyurethane, in order that the polyurethane molecule has an isocyanato group at the end, (a1) polyisocyanate compound must be used in excess of the sum of (a2) polyol compound and (a3) dihydroxy compound having a carboxyl group (isocyanato groups in total should be in excess of the hydroxyl groups in total). In case that (a5) monoisocyanate compound is introduced to polyurethane, in order that the polyurethane molecule has a hydroxy group at the end, (a1) polyisocyanate compound should be used less than the sum of (a2) polyol compound and (a3) dihydroxy compound having a carboxyl group (isocyanato groups in total should be less than hydroxyl groups in total).

Specifically, the molar ratio of the provided materials is that isocyanato group of (a1) polyisocyanate compound: (hydroxyl group of (a2) polyol compound+hydroxyl group of (a3) dihydroxy compound having a carboxyl group) is 0.5 to 1.5:1, preferably 0.8 to 1.2:1, and more preferably 0.95 to 1.05:1.

Further, hydroxyl group of (a2) polyol compound: hydroxyl group (a3) dihydroxy compound having a carboxyl group is 1:0.1 to 30, and preferably 1:0.3 to 10.

When (a4) monohydroxy compound is used, the molar number of (a1) polyisocyanate compound should be in excess of the molar number of ((a2) polyol compound+(a3) dihydroxy compound having a carboxyl group), and 0.5 to 1.5 times of molar amount, preferably 0.8 to 1.2 times of molar amount of (a4) monohydroxy compound is used, relative to the excess molar number of the isocyanato group.

When (a5) monoisocyanate compound is used, the molar number of ((a2)polyol compound+(a3) dihydroxy compound having a carboxyl group) should be in excess of the molar number of (a1) polyisocyanate compound, and 0.5 to 1.5 times of molar amount, preferably 0.8 to 1.2 times of molar amount of (a5) monoisocyanate compound is used, relative to the excess molar number of the hydroxyl group.

In order to introduce (a4) monohydroxy compound to (A) polyurethane containing a carboxyl group, when the reaction of (a2) polyol compound and (a3) dihydroxy compound having a carboxyl group with (a1) polyisocyanate compound is almost complete, (a4) monohydroxy compound is dropped to the reaction solution at 20 to 150° C., and more preferably at 70 to 120° C., to react the isocyanato groups remaining at both ends of (A) polyurethane containing a carboxyl group with (a4) monohydroxy compound, and the temperature is maintained until the end of the reaction.

In order to introduce (a5) monoisocyanate compound to (A) polyurethane containing a carboxyl group, when the reaction of (a2) polyol compound and (a3) dihydroxy compound having a carboxyl group with (a1) polyisocyanate compound is almost complete, (a5) monoisocyanate compound is dropped to the reaction solution at 20 to 150° C., and more preferably at 50 to 120° C., to react the hydroxyl groups remaining at both ends of (A) polyurethane containing a carboxyl group with (a5) monoisocyanate compound, and the temperature is maintained until the end of the reaction.

Examples of (B) epoxy compound include: an epoxy compound having two or more epoxy groups in one molecule, such as bisphenol-A type epoxy compound, hydrogenated bisphenol-A type epoxy resin, bisphenol-F type epoxy resin, novolak type epoxy resin, phenol novolak type epoxy resin, cresol novolak type epoxy resin, N-glycidyl type epoxy resin, bisphenol A novolak type epoxy resin, chelate type epoxy resin, glyoxal type epoxy resin, amino group-containing epoxy resin, rubber-modified epoxy resin, dicyclopentadiene phenolic type epoxy resin, silicone-modified epoxy resin, ε-caprolactone-modified epoxy resin, aliphatic-type epoxy resin containing a glycidyl group, alicyclic epoxy resin containing a glycidyl group, etc.

In particular, an epoxy compound having three or more epoxy groups in one molecule is more preferable. Examples of such an epoxy compound include: EHPE (registered trademark) 3150 (manufactured by Daicel Corporation), jER604 (manufactured by Mitsubishi Chemical Corporation), EPICLON EXA-4700 (manufactured by DIC Corporation), EPICLON HP-7200 (manufactured by DIC Corporation), pentaerythritol tetraglycidyl ether, pentaerythritol triglycidyl ether, TEPIC-S (manufactured by Nissan Chemical Corporation), and the like.

The (B) epoxy compound may contain a functional group having an aromatic ring, and in this case, the mass of (B) is preferably 20% by mass or less, relative to the total mass of (A) and (B).

The mixing ratio of (A) polyurethane containing a carboxyl group relative to (B) epoxy compound is preferably 0.5 to 1.5, more preferably 0.7 to 1.3, and still more preferably 0.9 to 1.1, in terms of equivalent ratio of the carboxyl groups of polyurethane relative to the epoxy groups of (B) epoxy compound.

Examples of (C) curing accelerator include: a phosphine-based compound such as triphenylphosphine, tributylphosphine (manufactured by Hokko Chemical Industry Co., Ltd.), Curezol (registered trademark) (imidazole-based epoxy resin curing agent: manufactured by Shikoku Chemicals Corporation), 2-phenyl-4-methyl-5-hydroxy methyl imidazole, U-CAT (registered trademark) SA series (DBU salt: manufactured by San-Apro Ltd.), Irgacure (registered trademark) 184, and the like. With respect to the used amount of these, if the amount is too small, the effect of addition cannot be obtained, whereas if the amount is too large, the electric insulation is decreased. Therefore, 0.1 to 10% by mass, more preferably 0.5 to 6% by mass, still more preferably 0.5 to 5% by mass, and particularly preferably 0.5 to 3% by mass, is used, relative to the total mass of (A) and (B).

Further, a curing aid may be used together. The curing aid may be a polyfunctional thiol compound, an oxetane compound, and the like. Examples of the polyfunctional thiol compound include: pentaerythritol tetrakis(3-mercaptopropionate), tris-[(3-mercaptopropionyloxy)-ethyl]-isocyanurate, trimethylolpropane tris(3-mercaptopropionate), Karenz (registered trademark) MT series (manufactured by Showa Denko K. K.), and the like. Examples of the oxetane compound include: ARON OXETANE (registered trademark) series (manufactured by Toagosei Co., Ltd.), ETER- NACOLL (registered trademark) OXBP or OXMA (manufactured by Ube Industries Ltd.), and the like. With respect to the used amount, if the amount is too small, the effect of addition cannot be obtained, whereas if the amount is too large, the curing rate becomes too high, resulting in decreasing handling property. Therefore, 0.1 to 10% by mass, and preferably 0.5 to 6% by mass is used, relative to the mass of (B).

The content of (D) solvent used in the protective film ink is preferably 95.0% by mass or more and 99.9% by mass or less, more preferably 96% by mass or more 99.7% by mass or less, and still more preferably 97% by mass or more 99.5% by mass or less. (D) solvent can be the solvent used for synthesizing (A) polyurethane containing a carboxyl group as it is. Further, other solvent may be used for (D) in order to adjust the solubility or printability of (A) polyurethane (containing a carboxyl group). When other solvent is used, the reaction solvent is distilled away before or after a new solvent is added, to replace the solvent. Taking into account the cumbersomeness of operations and the energy cost, using at least a part of the solvent used for synthesizing (A) polyurethane containing a carboxyl group as it is, is preferable. Taking the stability of the composition for the protective film into account, the contained solvent has a boiling point of preferably 80° C. to 300° C., and more preferably 80° C. to 250° C. If the boiling point is lower than 80° C., the ink is easily dried during the printing, which causes unevenness. If the boiling point is higher than 300° C., heat treatment at a high temperature for a long time is required for drying and curing, which is not suitable for industrial production.

Examples of the solvent include: a solvent used for synthesizing polyurethane such as propylene glycol monomethyl ether acetate (boiling point 146° C.), γ-butyrolactone (boiling point 204 C), diethylene glycol monoethyl ether acetate (boiling point 218° C.), tripropylene glycol dimethyl ether (boiling point 243° C.), etc., an ether-based solvent such as propylene glycol dimethyl ether (boiling point 97° C.), diethylene glycol dimethyl ether (boiling point 162° C.), etc., a solvent having a hydroxyl group such as isopropyl alcohol (boiling point 82° C.), t-butyl alcohol (boiling point 82° C.), propylene glycol monomethyl ether (boiling point 120° C.), diethylene glycol monomethyl ether (boiling point 194° C.), diethylene glycol monoethyl ether (boiling point 196° C.), diethylene glycol monobutyl ether (boiling point 230° C.), triethylene glycol (boiling point 276° C.), ethyl lactate (boiling point 154° C.), etc., and methyl ethyl ketone (boiling point 80° C.). One of these solvents may be used by itself, or a mixture of two or more types of them may be used. When two or more types of solvents are mixed, using a solvent having a hydroxy group and having a boiling point exceeding 100° C. in view of the solubility of the used polyurethane resin, epoxy resin., etc., and in order to prevent aggregation or precipitation, or using a solvent having a boiling point of 100° C. or lower in view of the drying property of the ink, in addition to the solvent used for synthesizing (A) polyurethane containing a carboxyl group, is preferable.

The above mentioned protective film ink can be produced by mixing (A) polyurethane containing a carboxyl group, (B) epoxy compound, (C) curing accelerator, and (D) solvent so that the content of (D) solvent becomes 95.0% by mass or more and 99.9% by mass or less, and stirring the mixture until the mixture becomes uniform.

The solid content in the protective film ink may differ depending on the desired film thickness or printing method, but is preferably 0.1 to 10% by mass, and more preferably 0.5% by mass to 5% by mass by mass. If the solid content is within the range of 0.1 to 10% by mass, when the ink is coated on a transparent conductive film, drawbacks such that the electrical contact cannot be obtained due to the thick film, do not occur, and a protective film having a sufficient weather resistance and light resistance can be obtained.

The above mentioned protective film ink is used for forming a printed pattern on a substrate having a conductive film formed thereon, by a printing method such as a bar-coating method, gravure printing, inkjet printing, slit coating, and the like, which is subjected to heat treatment and photoirradiation in accordance with needs, after the solvent is dried and removed, to thereby cure the ink and obtain a protective film. By forming the above protective film on the transparent conductive film formed on the transparent substrate, a conductive substrate having a transparent conductive film provided with a protective film which shows little change in sheet resistance and in haze after the photoirradiation, can be obtained. In the present specification, the term "transparent" refers to the state that the total light transmittance is 75% or more.

When the composition for the protective film is cured by heating, the heating is performed at the temperature of 100° C. or lower, and for the heating time of 10 minutes or less.

In particular, when a transparent conductive film or a transparent conductive pattern is produced by using a silver nanowire ink as the conductive ink, because the silver nanowire has a large surface area per unit mass, and fine wiring, etc., has low insulation reliability at a high temperature and high humidity, protection by the protective film ink according to the present aspect is effective.

The mass ratio between the binder resin and the silver nanowire (binder resin/silver nanowire) contained in the transparent conductive film or the transparent conductive pattern is preferably 0.8 or more and 20 or less. When the mass ratio is 0.8 or more, due to the interaction between the binder resin of the transparent conductive film or the transparent conductive pattern and the protective film, the reliability (environmental resistance) of the transparent conductive film or the transparent conductive pattern can be increased. Further, when the mass ratio is 20 or less, the electrical contact property can be ensured when the protective film is formed. The upper limit of the mass ratio between the binder and the silver nanowire (binder resin/silver nanowire) is preferably 10 or less, more preferably 5 or less, and still more preferably 3 or less.

EXAMPLES

Hereinbelow, specific examples of the present disclosure will be specifically explained. The examples are described below for the purpose of easy understanding of the present disclosure, and the present disclosure is not limited to these examples.

<Measurement of Thermal Decomposition Starting Temperature of Binder Resin>

The thermal decomposition starting temperature of the binder resin was measured by TG-DTA2000 manufactured by NETZSCH K. K. Approximately 10 mg of a sample was provided in a platinum pan and was subjected to measurement as below in an air atmosphere, and a thermal decomposition starting temperature was obtained as a temperature which is 120° C. or higher (in order to ignore the influences of the weight reduction which can be found around 100° C. relating to the moisture absorbed in the sample since preliminary drying of the sample was not performed), and at which weight reduction of 1% occurred.

Air Atmosphere, Temperature Conditions: room temperature→(10° C./min)→700° C. (compressor air 100 mL/min)

The thermal decomposition starting temperatures of the three type of binder resin used in Examples were 270° C. for PNVA, 200° C. for PVP, and 170° C. for ETHOCEL.

<Silver Nanowire>
Silver Nanowire 1

A silver nanowire dispersion liquid (dispersion medium: methanol) was purchased from Microwave Chemical Co., Ltd. The concentration of the silver nanowire 1 in the dispersion liquid was 0.2% by mass, the silver nanowires dispersed in the dispersion liquid had an average diameter of nm and an average length of 15 μm. The average diameter and the average length of the silver nanowires were obtained such that: several drops of the silver nanowire dispersion liquid were dropped on a silicon wafer, and dried, images of the silver nanowires deposited on the silicon wafer after the drying were captured by the ultra-high-resolution field-emission-type scanning electron microscope SU8020 (accelerating voltage: to 10 kV), manufactured by Hitach High-Technologies Corporation, images of 50 silver nanowires were arbitrarily selected and measured, and arithmetic average values of the measurement results were obtained.

0.3 ml of the dispersion liquid was weighed, and gradually heated by a hot plate. After most of the solvent was removed, a combustion improver ($WO_3$) was added, which was subjected to moisture flow and combustion decomposition in oxygen flow by a sample combustion unit AQF-100 (Mitsubishi Chemical Analytech Co., Ltd.).

The generated gas was collected in a gas absorbent liquid, which was subjected to halogen measurement by the anion chromatography system DIONEX ICS-1600 (Thermo Fischer Scientific), and the results were converted to sample liquid concentration. The halogen concentration in the dispersion liquid was 20 mass ppm. The amount of halogen was 1% by mass for the silver nanowire.

Silver Nanowire 2

Polyvinylpyrrolidone K-90 (manufactured by Nippon Shokubai Co., Ltd.)(0.98 g), $AgNO_3$ (1.04 g), and $FeCl_3$ (0.8 mg) were dissolved in ethylene glycol (250 ml), and subjected to thermal reaction at 150° C. for one hour. The obtained silver nanowire coarse dispersion liquid was dispersed in 2000 ml of methanol, which was poured into a desktop small tester (using ceramic membrane filter Cefilt, membrane area: 0.24 m$^2$, pore size: 2.0 μm, size Φ: 30 mm×250 mm, filter differential pressure: 0.01 MPa, manufactured by NGK Insulators, Ltd.), and was subjected to cross-flow filtration at a circulation flow rate of 12 L/min and a dispersion liquid temperature of 25° C., to remove impurities. Thereafter, the obtained dispersion liquid was condensed, and methanol was appropriately added thereto, so that the calculated silver concentration became approximately 0.2% by mass. A part (10 g) of the methanol dispersion liquid was weighed in a PFA container, and dried by heating at 100° C. for 6 hours. The solid obtained after the drying was heated by a thermogravimetric analyzer (differential type differential thermal balance TG-DTA2000SE, manufactured by NETZSCH) at a temperature increase rate of 10° C./min to 500° C. The residue at the 500° C. was treated as a mass of silver, and the amount of component in the dispersion liquid was simply measured. As a result, the silver concentration of the obtained silver nanowire 2 in the methanol dispersion liquid was 0.2% by mass, and the silver nanowire 2 had an average diameter of 36 nm, and an average length of 20 μm. The average diameter and the average length of the silver nanowire 2 were arithmetic average values obtained through observation of 500 silver nanowires by SEM. Further, the abovementioned methanol, ethylene glycol, $AgNO_3$, and $FeCl_3$ were the ones manufactured by manufactured by Wako Pure Chemical Industries, Ltd.

<Preparation of Silver Nanowire Ink>

Preparation Example 1 (silver nanowire ink 1) 174 g of silver nanowire methanol dispersion liquid containing the silver nanowire 1 (silver concentration: 0.2% by mass, dispersion medium: methanol, wire average diameter: 26 nm, average length: 15 μm) was weight in a 1000 ml eggplant flask. 3.1 g of 10% by mass PNVA (poly-N-vinylacetamide) aqueous solution (weight average molecular weight: approximately 900,000, manufactured by Showa Denko K. K.), 40.9 g of propylene glycol (manufactured by Wako Pure Chemical Industries, Ltd.), 112.3 g of PGME (propylene glycol monomethyl ether) (manufactured by Tokyo Chemical Industry Co., Ltd.) were added thereto, and dispersed well. Thereafter, methanol was distilled away, by using an evaporator. Then, 63.2 g of pure water, 300 g of ethanol (manufactured by Kanto Chemical Co., Inc.), and 49.3 g of methanol (manufactured by Junsei Chemical Co., Ltd.) were added and stirred by using planetary centrifugal vacuum mixer Awatori Rentaro (registered trademark) ARV-310, manufactured by Thinky Corporation, to obtain silver nanowire ink 1.

Preparation Example 2 (Silver Nanowire Ink 2)

Except that PNVA aqueous solution used in the Preparation Example 1 was changed to 10% by mass aqueous solution of PVP K-90 (poly(N-vinylpyrrolidone), manufactured by Nippon Shokubai Co., Ltd.), the preparation was performed in the same way as Preparation Example 1, and then, silver nanowire ink 2 was obtained.

Preparation Example 3 (Silver Nanowire Ink 3)

Except that PNVA aqueous solution used in the Preparation Example 1 was changed to 10% by mass PGME solution of ETHOCEL (registered trademark) STD100cps (ethyl cellulose, manufactured by Nisshin Kasei Co., Ltd.), and that the addition amount of PGME was changed to 109.5 g and the addition amount of pure water was changed to 66 g, the preparation was performed in the same way as Preparation Example 1, and then, silver nanowire ink 3 was obtained.

Preparation Example 4 (Silver Nanowire Ink 4)

174 g of the methanol dispersion liquid of silver nanowire 2 (silver concentration: 0.2% by mass, dispersion medium: methanol, wire average diameter: 36 nm, average length: 20 μm) produced as above, was weighed in a 1000 ml eggplant flask. 3.1 g of 10% by mass PNVA aqueous solution (manufactured by Showa Denko K. K.), 40.9 g of propylene glycol (manufactured by Wako Pure Chemical Industries, Ltd.), and 112.3 g of PGME (manufactured by Tokyo Chemical Industry Co., Ltd.) were added thereto, and dispersed well. Thereafter, methanol was distilled away, by using an evaporator. Then, 63.2 g of pure water, 300 g of ethanol (manufactured by Kanto Chemical Co., Inc.), and 49.3 g of methanol (manufactured by Junsei Chemical Co., Ltd.) were added and stirred by using planetary centrifugal vacuum mixer Awatori Rentaro (registered trademark) ARV-310, manufactured by Thinky Corporation, to obtain silver nanowire ink 4 having a mass ratio between the binder resin (PNVA) and the silver nanowire (binder resin/silver nanowire) of 0.87.

Preparation Examples 5 to 12 (Silver Nanowire Inks to 12)

Except that the types and the amounts of the binder resin shown in Table 3 were used, the preparation was performed in the same way as Preparation Example 4, and then, the silver nanowire inks 5 to 12 were obtained, respectively.

Table 3 shows the mass ratio between the binder resin and the silver nanowire contained in the obtained silver nanowire ink (binder resin/silver nanowire). The silver concentration of the obtained silver nanowire ink was measured by AA280Z Zeeman atomic absorption spectrophotometer, manufactured by Varian, and the amount of the binder resin was measured by GPC.

<Printing of Silver Nanowire Ink Coating Film>

Using each of the silver nanowire inks 1 to 12 prepared by Preparation Examples 1 to 12, a 20-cm-square transparent conductive pattern of a solid print (silver nanowire ink coating film) with a wet film thickness of 15 μm was printed on a main face of a COP film (ZEONOR (registered trademark) ZF14, 50 μm thick, manufactured by Zeon Corporation) having a plasma treated surface, by a slit coater (FLOLIA (registered trademark), manufactured by Chugai Ro Co., Ltd.). The plasma treatment was performed under the air atmosphere, at the power output of 405 V for 3 seconds, using AP-T03 AtomosPheric High-density Plasma Cleaning System, manufactured by Sekisui Chemical Co., Ltd. After performing the solvent drying at 100° C., for 10 minutes, using a constant temperature chamber ETAC HS350 manufactured by Kusumoto Chemicals Ltd., the surface resistance of the obtained transparent conductive pattern was measured. The surface resistance is an arithmetic average value of surface resistances measured at 16 points around the center of each 5-cm-square area defined by dividing the transparent conductive pattern (solid print). The surface resistance of the transparent conductive pattern using each of the silver nanowire inks 1 to 3 was 40Ω/□. The surface resistance of the transparent conductive pattern using each of the silver nanowire inks 4 to 12 was Q/□. The surface resistance was measured using a non-contact type resistance measurement instrument (EC-80P, manufactured by Napson Corporation) and a contact type resistance measurement instrument (Loresta GP MCP-T610, manufactured by Mitsubishi Chemical Analytech Co., Ltd.).

<Production of Protective Film Ink>

Synthesis Example of (A) Polyurethane Containing Carboxyl Group 16.7 g of C-1015N (polycarbonate diol, molar ratio of raw material diols: 1,9-nonanediol:2-methyl-1,8-octanediol=15:85, molecular weight: 964, manufactured by Kuraray Co., Ltd.) as a polyol compound, 10.8 g of 2,2-dimethylol butanoic acid (manufactured by Huzhou Changsheng Chemical Co., Ltd.) as a dihydroxyl compound containing a carboxyl group, and 62.6 g of diethylene glycol monoethyl ether acetate (manufactured by Daicel Corporation) as a solvent were provided in a 2 L three-neck flask having a stirrer, a thermometer, and a condenser (reflux condenser), and the 2,2-dimethylol butanoic acid was dissolved at 90° C.

The temperature of the reaction liquid was lowered to 70° C., and 23.5 g of Desmodur (registered trademark)-W (bis(4-isocyanate cyclohexyl)methane), manufactured by Sumika Covestro Urethane Co., Ltd.) as polyisocyanate was dropped thereto for 30 minutes by a dropping funnel. After the dropping was complete, the temperature was raised to 100° C., and the reaction was performed at 100° C. for 15 hours. After the confirmation by IR that almost all of the isocyanate disappeared, 0.5 g of isobutanol was added, which was further reacted at 100° C. for 6 hours. The obtained carboxyl group-containing polyurethane had a weight average molecular weight, obtained by GPC, of 33500, and a resin solution thereof had an acid value of 39.4 mgKOH/g.

Protective Film Ink 1

1.8 g of (A) polyurethane solution containing a carboxyl group (solid content: 42.4% by mass), 0.11 g of pentaerythritol tetraglycidyl ether (manufactured by Showa Denko K. K.) as (B) epoxy compound, 0.048 g of SA102 (DBU octyl acid salt) (manufactured by San-Apro Ltd.) as (C) curing accelerator, and 31.78 g of a mixture of isopropyl alcohol (IPA) and diethylene glycol monoethyl ether (EC) (IPA:EC=40:60 (mass ratio)) as (D) solvent were added, which was stirred at 1200 rpm for 20 minutes to become uniform, by using Awatori Rentaro (registered trademark) ARV-310, i.e., a planetary centrifugal vacuum mixer manufactured by Thinky Corporation. Thereby, the protective film ink 1 was obtained. According to the calculation using masses before and after the solvent drying, the protective film ink 1 had a solid content (total of polyurethane containing a carboxyl group, epoxy compound, and curing accelerator) of 3% by mass.

Protective Film Ink 2

Except that the compound mixed in the protective film ink 1 as (B) epoxy compound was changed to 0.15 g of jER (registered trademark)-604 (N,N,N',N'-tetraglycidyl diaminodiphenyl methane type epoxy compound, manufactured by Mitsubishi Chemical Corporation), preparation was performed in the same way as the preparation of the protective film ink 1, and the protective film ink 2 was obtained. According to the calculation using masses before and after the solvent drying, the protective film ink 2 had a solid content (total of (A) polyurethane containing a carboxyl group, (B) epoxy compound, and (C) curing accelerator) of 3% by mass.

Protective Film Ink 3

10 g of SHIKOH (registered trademark) UV-7620EA (solid content: 35% by mass, manufactured by Nippon Synthetic Chemical Industry Co., Ltd.) was diluted by 106.7 g of ethyl acetate, and, 175 mg of Irgacure (registered trademark) 184 (manufactured by BASF) was added thereto as a photoinitiator, which was stirred at 1200 rpm for 20 minutes to become uniform, by using Awatori Rentaro (registered trademark) ARV-310, i.e., a planetary centrifugal vacuum mixer manufactured by Thinky Corporation. Thereby, the protective film ink 3 was obtained. According to the calculation using masses before and after the solvent drying, the protective film ink 3 had a solid content of 3% by mass.

Protective Film Ink 4

Except that the mixture amount of (B) epoxy compound in the protective film ink 1 was changed to 0.06 g, preparation was performed in the same way as the preparation of the protective film ink 1, and the protective film ink 4 was obtained.

Protective Film Ink 5

Except that the mixture amount of (B) epoxy compound in the protective film ink 1 was changed to 0.17 g, preparation was performed in the same way as the preparation of the protective film ink 1, and the protective film ink 5 was obtained.

Protective Film Ink 6

Except that the mixture amount of (B) epoxy compound in the protective film ink 2 was changed to 0.08 g, preparation was performed in the same way as the preparation of the protective film ink 2, and the protective film ink 6 was obtained.

Protective Film Ink 7

Except that (D) solvent mixed in the protective film ink 2 was changed to 31.78 g of diethylene glycol monoethyl ether (EC), preparation was performed in the same way as the preparation of the protective film ink 2, and the protective film ink 7 was obtained.

<Printing of Protective Film>

Example 1

A silver nanowire ink coated film was printed by using the silver nanowire ink 1 obtained according to Preparation Example 1, on the main face of a COP film having a plasma treated surface (plasma treatment being performed under the air atmosphere, at the power output of 405 V for 3 seconds, using AP-T03 AtomosPheric High-density Plasma Cleaning System, manufactured by Sekisui Chemical Co., Ltd.), and the protective film ink 1 was coated on the silver nanowire coated ink film by the above-mentioned slit coater. The resultant was dried and cured at 100° C., for 15 minutes, using a constant temperature chamber ETAC HS350 manufactured by Kusumoto Chemicals Ltd., to thereby obtain transparent conductive substrate according to Example 1. In this case, the total thickness of the silver nanowire ink coated film and the protective film was 100 nm.

Examples 2 to 5, Comparative Examples 1 to 6

Using combinations shown in Table 1, silver nanowire ink coated films and protective films were produced in the same way as Example 1, and transparent conductive substrates were prepared, respectively.

In Comparative Example 3, at the time of coating the protective film, instead of the drying and curing at 100° C. for 15 minutes, drying was performed at 100° C. for 5 minutes, using the constant temperature chamber ETAC HS350 manufactured by Kusumoto Chemicals Ltd., and thereafter, curing was performed by irradiating ultraviolet light having a wavelength of 254 nm, at 750 mJ/cm$^2$, using a small UV irradiation apparatus QRU-2161-Z11-00 (ORC Manufacturing Co., Ltd.).

TABLE 1

|  | Silver Nanowire Ink | Binder Resin | Protective Film Ink |
|---|---|---|---|
| Example 1 | 1 | PNVA | 1 |
| Example 2 | 1 | PNVA | 2 |
| Example 3 | 1 | PNVA | 4 |
| Example 4 | 1 | PNVA | 5 |
| Example 5 | 1 | PNVA | 6 |
| Comparative Example 1 | 2 | PVP | 1 |
| Comparative Example 2 | 3 | ETHOCEL | 1 |
| Comparative Example 3 | 1 | PNVA | 3 |
| Comparative Example 4 | 1 | PNVA | none |
| Comparative Example 5 | 2 | PVP | none |
| Comparative Example 6 | 3 | ETHOCEL | none |

Evaluation of Transparent Conductive Film Contact Resistance

With respect to each of the transparent conductive substrates according to Examples and Comparative Examples, before the photoirradiation in the below-mentioned light resistance test, surface resistance was measured at each of arbitrarily selected 10 points in the film from above the protective film, using a contact type resistance measurement instrument (Loresta GP MCP-T610, manufactured by Mitsubishi Analytech Co., Ltd.).

When the surface resistance could be measured (resistance value equal to or lower than the measurement upper limit value of the measurement device ($10^7 \Omega/\square$) was obtained) at all of the 10 measurement points, the film was evaluated as "good", and when the surface resistance could not be measured at any one of the points, the film was evaluated as "poor". The results are shown in Table 2.

Light Resistance Test

Using the solar simulator YSS-80B (manufactured by Yamashita Denso Corporation), irradiation at 1 sun (1000 W/m$^2$) for 250 hours was performed. Thereafter, sheet resistances and optical properties (haze) were evaluated.

<Sheet Resistance>

According to the measurement using the non-contact type resistance measurement instrument (EC-80P, probe type High: 10 to $1000 \Omega/\square$, manufactured by Napson Corporation), evaluation on the basis of below was performed. The results are shown in Table 2.

Good: After the light resistance test, the increase rate from the initial value was 10% or less.

Fair: After the light resistance test, the increase rate from the initial value was more than 10% and 20% or less.

Poor: After the light resistance test, the increase rate from the initial value was more than 20%.

N/A: After the light resistance test, measurement was impossible (measurement upper limit was exceeded).

The initial value is a surface resistance ($40 \Omega/\square$) of the above-mentioned transparent conductive pattern.

<Haze>

Test pieces, after the light resistance test, were measured by Haze meter NDH 2000 (manufactured by Nippon Denshoku Industries Co., Ltd.), and evaluated in accordance with below. The results are shown in Table 2.

Good: After the light resistance test, the increase rate from the initial value was 30% or less.

Fair: After the light resistance test, the increase rate from the initial value was more than 30% and 35% or less.

Poor: After the light resistance test, the increase rate from the initial value was more than 35%.

The initial value is a haze of a conductive substrate before the photoirradiation (in Examples to 5, Comparative Examples 1, 2, and 4 to 6, within the range from 0.95 to 1.1, in Comparative Example 3, 1.3).

TABLE 2

|  | Contact Resistance | Change in Sheet Resistance | Change in Haze |
|---|---|---|---|
| Example 1 | Good | Good | Good |
| Example 2 | Good | Good | Fair |
| Example 3 | Good | Fair | Good |
| Example 4 | Good | Good | Good |
| Example 5 | Good | Fair | Good |
| Comparative Example 1 | Good | Good | Poor |

TABLE 2-continued

|  | Contact Resistance | Change in Sheet Resistance | Change in Haze |
|---|---|---|---|
| Comparative Example 2 | Good | Poor | Good |
| Comparative Example 3 | Good | Poor | Poor |
| Comparative Example 4 | Good | N/A | Poor |
| Comparative Example 5 | Good | N/A | Poor |
| Comparative Example 6 | Good | N/A | Poor |

The contact resistance could be measured for all of the transparent conductive substrates obtained by Examples 1 to 5 and Comparative Examples 1 to 6, and thus, all of them are determined as useful as an electrode for an electronic device. However, according to Comparative Examples 4 to 6 wherein no protective film is applied, after the light resistance test for 250 hours, sheet resistance could not be measured in all of Comparative Examples 4 to 6, and thus, the function as a conductive substrate was lost. It is assumed that when no protective film is applied, the silver nanowires become particles, and thus, the haze increases, and the sheet resistance cannot be measured.

When Example 1 is compared with Comparative Examples 1 and 2, although the protective films are the same, the haze is deteriorated in Comparative Example 1, and the increase of resistance exceeds 20% in Comparative Example 2. This difference occurs because the binder resins are different, and thus, deterioration differently occurs. The deterioration due to light occurs because the resin itself is decomposed, and the function as a binder resin cannot be maintained. The thermal decomposition starting temperature can be an index for the deterioration rate. The resin decomposition by heat also occurs due to the addition of energy. Thus, although the mechanisms are different, there are no problems for using the thermal decomposition starting temperature as an index for the deterioration due to light. The binder resin PNVA which did not show deterioration in resistance nor haze, has a thermal decomposition starting temperature of 270° C., whereas, PVP has that of 200° C., and ETHOCEL has that of 170° C. Only PNVA which has a high thermal decomposition starting temperature seems to maintain the function. Further, regarding the protective film, having a higher thermal decomposition starting temperature is also preferable, i.e., 250° C. or higher is preferable, and 270° C. or higher is more preferable. Each of the protective films 1, 2, and 4 to 6 used in Examples has a thermal decomposition starting temperature of approximately 300° C.

FIG. 1 and FIG. 2 show photographs of conductive substrates after the light resistance test, according to Example 1 and Comparative Example 1, respectively. Compared to FIG. 1, FIG. shows a larger number of particle-like impurities attached on the side faces of the silver nanowires. The reason therefor is assumed that the degree of deterioration to the binder resin due to the light resistance test is greater in PVP compared to PNVA.

In Example 1, 2 and Comparative Example 3, PNVA was used as a binder resin, but the protective films were different among them. In Examples 1 and 2, a thermosetting resin was used for a protective film, whereas in Comparative Example 3, a photocurable resin was used for a protective film. It is considered that the deterioration in both resistance and haze in Comparative Example 3 comes from the residue (mainly, aromatic rings) of the photoinitiator. It is assumed that because more light was absorbed in Comparative Example 3, more deterioration occurred, compared to Examples 1 and 2. In Example 2, the haze was slightly deteriorated, although the deterioration degree was within an acceptable range for use. It is considered that the reason therefor is the use of a compound having an aromatic ring, for the protective film, which contributes to accelerate the deterioration, although not so much as the case of Comparative Example 3. With respect to both the binder resin and the protective film, containing smaller amount of a compound having an aromatic ring in a molecule is preferable, and containing no compound having an aromatic ring is the most preferable.

In Examples 3, 4, the protective film inks 4, in each of which the amount of the epoxy compound for the protective film ink 1 used in Example 1 was changed, were used, respectively. Both Examples 3 and 4 show preferable durability and light resistance. This reveals that when the epoxy compound used is an aliphatic polyfunctional epoxy compound, increase of the amount of use has no influence on the light resistance. On the other hand, in Example 5, the protective film ink in which the amount of the epoxy compound for the protective film ink 2 used in Example 2 was changed, was used. Both Examples 2 and 5 show preferable durability and light resistance. However, when the amount of the polyfunctional epoxy compound having an aromatic ring is increased, the ratio of the aromatic rings increases, which is considered to have a bad influence on the light resistance. The ratio (% by mass) of the aromatic ring-containing compound in the protective film can be defined by the following formula:

$$[(\text{use amount of aromatic ring-containing compound})/(\text{mass of protective film (mass of urethane resin+mass of epoxy compound}))] \times 100\ (\%)$$

The ratio of the aromatic ring-containing compound in the protective film is 20% by mass or less in both Examples 2 and 5 (the ratio being 15.6%, 8.99%, respectively). Example 5 with a smaller ratio of the aromatic ring-containing compound shows more preferable result with lower haze. This suggests that the ratio of the aromatic ring-containing compound in the protective film is preferably suppressed to 15% by mass or less.

Examples 6 to 9 and Comparative Examples 7 to 11

The protective film ink 7 was printed to cover each of the 20-cm-square solid printed films formed by coating the silver nanowire inks 4 to 12 produced as above with different types of binders and with different concentrations, respectively, by the above-mentioned slit coater, and was subjected to thermal curing at 100° C., for 10 minutes, to form a protective film and obtain each of the transparent conductive substrates according to Example 6 to 9 and Comparative Example 7 to 11.

According to the SEM observation of the cross-sectional surface, using JSM-7500FA, manufactured by JEOL Ltd., in Example 5, the total thickness of the silver nanowire layer (transparent conductive film) and the cured protective film was approximately 100 nm.

The contact resistance, environmental resistance, and optical property of the obtained transparent conductive substrates according to Example 6 to 9 and Comparative Example 7 to 11 were measured by the following methods. Table 3 shows the results.

Contact Resistance: Measured by Loresta GP MCP-T610, manufactured by Mitsubishi Chemical Analytech Co., Ltd. The measurement was performed at arbitrarily selected 10 points on the protective film. When resistance could be measured at all measurement points, the film was evaluated as "good"; resistance could be measured at some of the points, the film was evaluated as "fair"; and resistance could not be measured at any of the points, the film was evaluated as "poor".

Environmental Resistance: In a thermo-hygrostat chamber maintained at 85° C., 85%, if the change in resistance after 500 hours passed was 10% or less, the reliability was evaluated as "good", if the change exceeds 10% and 20% or less, evaluated as "fair", and if the change exceeds 20%, evaluated as "poor".

Optical Property: In a thermo-hygrostat chamber maintained at 85° C., 85%, if the change in haze and total light transmittance of the film measured (by Haze meter NDH 2000 (manufactured by Nippon Denshoku Industries Co., Ltd.)) after 500 hours passed was both 10% or less, the optical property was evaluated as "good", if either of them exceeds 10% and 20% or less, evaluated as "fair", if both exceeds 20%, evaluated as "poor".

TABLE 3

|  | Silver Nanowire Ink | Binder Resin | Mass Ratio (binder resin/silver nanowire) | Contact Resistance | Environmental Tolerance | Optical Property |
| --- | --- | --- | --- | --- | --- | --- |
| Example 6 | 4 | PNVA | 0.87 | Good | Good | Good |
| Example 7 | 5 | PNVA | 1.00 | Good | Good | Good |
| Example 8 | 6 | PNVA | 1.30 | Good | Good | Good |
| Example 9 | 7 | PNVA | 1.57 | Good | Good | Good |
| Comparative Example 7 | 8 | PNVA | 0.78 | Good | Poor | Good |
| Comparative Example 8 | 9 | PVP | 0.78 | Good | Poor | Good |
| Comparative Example 9 | 10 | ETHOCEL | 0.78 | Good | Poor | Poor |
| Comparative Example 10 | 11 | PVP | 1.00 | Good | Fair | Good |
| Comparative Example 11 | 12 | ETHOCEL | 1.00 | Good | Fair | Poor |

As can be seen from the results shown in Table 3, in view of Examples 6 to 9 and Comparative Example 7, even if the same binder resin is used, if the mass ratios between the binder resin and the silver nanowire (binder resin/silver nanowire) are different, the environmental resistance becomes different. The reason therefor is assumed that, if the mass ratio between the binder resin used and the silver nanowire (binder resin/silver nanowire) is less than 0.8, the functional groups in the binder resin are structured to gather around silver, and thus, the functional group concentration in the binder at the surface of the transparent conductive film (binder resin) [refers to the binder resin constituting the transparent conductive film] is decreased, which leads to the decrease of affinity with the protective film. Whereas, if the mass ratio between the binder resin and the silver nanowire (binder resin/silver nanowire) is 0.8 or more, the affinity between the transparent conductive film (binder resin) and the protective film increases, and during the curing, the functional groups in the protective film resin ((A) polyurethane containing a carboxyl group, etc.) gather around the surface of the transparent conductive film (binder resin), which causes a density gradient, and accelerates curing. In view of the results of Example 6 and Comparative Examples 8 to 11, when a binder resin other than PNVA is used, the reliability and the optical property decrease. The reasons therefor are assumed that the functional groups of the used binder resins are different, and the affinity with the protective film is decreased. In PVP and ETHOCEL, mainly, oxygen atoms seem to interact with the carboxyl groups in (A) polyurethane containing a carboxyl group. Whereas, in PNVA, because of the amide bonds (—NH—CO—), not only the interaction with the carboxyl groups in (A) polyurethane containing a carboxyl group, but also the interaction with urethane bonds (—NH—COO—) occurs. Therefore, the protective film resin is more strongly drawn to the boundary to the transparent conductive film (binder resin).

The invention claimed is:

1. A transparent conductive substrate comprising,
a substrate,
a transparent conductive film formed on at least one main face of the substrate and containing a binder resin and conductive fibers, and
a protective film formed on the transparent conductive film,
wherein the binder resin is a homopolymer of N-vinylacetamide (NVA),
the protective film is a thermal-cured film made of a thermosetting resin composition which contains (A) a polyurethane containing a carboxyl group, (B) an epoxy compound, and (C) a curing accelerator, and in which the ratio of an aromatic ring-containing compound in the solid content of the thermosetting resin composition is 15% by mass or less,
the conductive fiber is a metal nanowire,
the mass ratio between the binder resin and the metal nanowire (binder resin/metal nanowire) is 0.8 or more and 20 or less, and
the (B) epoxy compound is pentaerythritol tetraglycidyl ether or N,N,N',N'-tetraglycidyl diaminodiphenyl methane epoxy compound.

2. A transparent conductive substrate according to claim 1, wherein the metal nanowire is a silver nanowire.

3. A transparent conductive substrate according to claim 1, wherein both of the protective film and the binder resin have no aromatic ring in a molecule.

4. A transparent conductive substrate according to claim 1, wherein the substrate is a resin film.

5. A method for producing the transparent conductive substrate according to claim 1, the method comprising:

a step of forming a transparent conductive film by a conductive ink which contains a binder resin and conductive fibers, on at least one main face of a substrate, wherein the binder resin is a homopolymer of N-vinylacetamide (NVA), a step of forming a protective film, by a thermosetting protective film ink, on the transparent conductive film, the thermosetting protective film ink containing (A) a polyurethane containing a carboxyl group, (B) an epoxy compound, and (C) a curing accelerator, and (D) a solvent, the content of (D) solvent being 95.0% by mass or more and 99.9% by mass or less, the (B) epoxy compound being pentaerythritol tetraglycidyl ether or N,N,N',N'-tetraglycidyl diaminodiphenyl methane epoxy compound, and the ratio of an aromatic ring-containing compound in the solid content of the protective film ink being 15% by mass or less, and a step of heating and curing the protective film, wherein the conductive fiber is a metal nanowire, and the mass ratio between the binder resin and the metal nanowire (binder resin/metal nanowire) is 0.8 or more and 20 or less.

6. A method for producing a transparent conductive substrate according to claim 5, wherein the metal nanowire is a silver nanowire.

7. The transparent conductive substrate according to claim 4, wherein the material for the resin film is one selected from the group consisting of a polyester, a polycarbonate, an acrylic resin and a cycloolefin polymer.

8. The transparent conductive substrate according to claim 7, wherein the polyester is polyethylene terephthalate or polyethylene naphthalate, and the acrylic resin is polymethyl methacrylate.

9. The transparent conductive substrate according to claim 4, wherein the material for the resin film is polyethylene terephthalate or a cycloolefin polymer.

10. The transparent conductive substrate according to claim 9, wherein the material for the resin film is a cycloolefin polymer.

11. The transparent conductive substrate according to claim 1, wherein the mass ratio between the binder resin and metal nanowire forming the transparent conductive film is 0.87 or more and 20 or less.

12. The transparent conductive substrate according to claim 1, wherein the mass ratio between the binder resin and metal nanowire forming the transparent conductive film is 0.87 to 1.57.

13. The transparent conductive substrate according to claim 1, wherein a mixing ratio of (A) polyurethane containing a carboxyl group relative to (B) epoxy compound is 0.5 to 1.5, in terms of equivalent ratio of the carboxyl groups in (A) polyurethane containing a carboxyl group relative to the epoxy groups in (B) epoxy compound.

* * * * *